(12) United States Patent
Park et al.

(10) Patent No.: US 10,515,819 B2
(45) Date of Patent: Dec. 24, 2019

(54) SEMICONDUCTOR DEVICE

(71) Applicant: Samsung Electronics Co., Ltd., Suwon-si (KR)

(72) Inventors: Ji Hoon Park, Hwaseong-si (KR); Joong Shik Shin, Yongin-si (KR); Byoung Il Lee, Seoul (KR); Jong Ho Woo, Hwaseong-si (KR); Eun Taek Jung, Seongnam-si (KR); Jun Ho Cha, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/844,681

(22) Filed: Dec. 18, 2017

(65) Prior Publication Data

US 2019/0013206 A1 Jan. 10, 2019

(30) Foreign Application Priority Data

Jul. 7, 2017 (KR) .................. 10-2017-0086435

(51) Int. Cl.
*H01L 27/11531* (2017.01)
*H01L 21/3105* (2006.01)
*H01L 21/763* (2006.01)
*H01L 21/28* (2006.01)
*H01L 21/8238* (2006.01)
(Continued)

(52) U.S. Cl.
CPC .. *H01L 21/31051* (2013.01); *H01L 21/28141* (2013.01); *H01L 21/763* (2013.01); *H01L 21/76229* (2013.01); *H01L 21/823878* (2013.01); *H01L 27/11531* (2013.01); (Continued)

(58) Field of Classification Search
None
See application file for complete search history.

(56) References Cited

U.S. PATENT DOCUMENTS 5,909,628 A 6/1999 Chatterjee et al.
6,838,736 B2 * 1/2005 Ishikura ............... H01L 21/761
257/368

(Continued)

FOREIGN PATENT DOCUMENTS

JP 3719650 B2 11/2005
JP 2008-085101 A 4/2008
(Continued)

OTHER PUBLICATIONS

Search Report and Written Opinion for Singapore patent Application No. 10201805399S dated Sep. 24, 2018.

*Primary Examiner* — Charles D Garber
*Assistant Examiner* — Steven M Christopher
(74) *Attorney, Agent, or Firm* — Muir Patent Law, PLLC

(57) ABSTRACT

A semiconductor device includes a substrate having a first region and a second region, the first region including memory cells, and the second region including transistors for driving the memory cells, and device isolation regions disposed within the substrate to define active regions of the substrate. The active regions include a first guard active region surrounding the first region, a second guard active region surrounding a portion of the second region, and at least one dummy active region disposed between the first guard active region and the second guard active region.

20 Claims, 17 Drawing Sheets

(51) Int. Cl.
*H01L 27/11573* (2017.01)
*H01L 27/11592* (2017.01)
*H01L 21/762* (2006.01)
*H01L 21/311* (2006.01)

(52) U.S. Cl.
CPC .. *H01L 27/11573* (2013.01); *H01L 27/11592* (2013.01); *H01L 21/31144* (2013.01)

(56) References Cited

U.S. PATENT DOCUMENTS

| | | |
|---|---|---|
| 7,719,061 B2 | 5/2010 | Park |
| 8,242,583 B2 | 8/2012 | Yune et al. |
| 2004/0084777 A1 | 5/2004 | Yamanoue et al. |
| 2009/0121296 A1 | 5/2009 | Kwon et al. |
| 2010/0223585 A1 | 9/2010 | Chern |
| 2011/0008967 A1 | 1/2011 | Kim et al. |
| 2012/0292712 A1 | 11/2012 | Baek et al. |
| 2015/0348987 A1 | 12/2015 | Lee et al. |
| 2016/0163686 A1 | 6/2016 | Lee et al. |
| 2016/0225714 A1* | 8/2016 | Yun .................. H01L 27/11573 |
| 2016/0233297 A1 | 8/2016 | Tomoyama |

FOREIGN PATENT DOCUMENTS

| | | |
|---|---|---|
| KR | 10-0155874 B1 | 12/1998 |
| KR | 10-0536805 B1 | 12/2005 |
| KR | 2008-0039095 A | 5/2008 |
| KR | 10-0650870 B1 | 7/2008 |
| KR | 10-1043870 B1 | 6/2011 |

\* cited by examiner

SEMICONDUCTOR DEVICE

CROSS-REFERENCE TO RELATED APPLICATION

This application claims benefit of priority to Korean Patent Application No. 10-2017-0086435, filed on Jul. 7, 2017 in the Korean Intellectual Property Office, the disclosure of which is incorporated herein by reference in its entirety.

BACKGROUND

1. Field

The present inventive concept relates to a semiconductor device.

2. Description of Related Art

As the demand for high performance, high speed, and/or multifunctionalization in electronic devices increases, the degree of integration of semiconductor devices in electronic devices is increasing. With the trend for high degrees of integration in semiconductor devices, patterns forming semiconductor devices have been made compact. Accordingly, it has become increasingly important to prevent defects in the manufacturing process of semiconductor devices.

SUMMARY

An aspect of the present inventive concept may provide a semiconductor device having increased reliability.

According to an aspect of the present disclosure, a semiconductor device may include: a substrate having a first region and a second region, the first region including memory cells, and the second region including transistors for driving the memory cells; and device isolation regions disposed within the substrate to define active regions of the substrate, in which the active regions may include: a first guard active region surrounding the first region; a second guard active region surrounding a portion of the second region; and at least one dummy active region disposed between the first guard active region and the second guard active region.

According to an aspect of the present disclosure, a semiconductor device may include: a substrate having a first region and a second region, the first region including a cell active region having memory cells disposed therein, and the second region disposed on at least one side of the first region, in which the second region may include at least one dummy active region, the at least one dummy active region extending in one direction along a boundary between the first region and the second region.

According to an aspect of the present disclosure, a semiconductor device may include: a gate electrode structure including gate electrodes, the gate electrodes spaced apart from one another and stacked on a substrate in a first direction perpendicular to the substrate, and the gate electrodes extending to have different lengths in a second direction, perpendicular to the first direction; a guard active region disposed within the substrate to surround the gate electrode structure; and at least one dummy active region disposed on at least one side of the guard active region in the second direction, the at least one dummy active region being disposed within the substrate to extend parallel to the guard active region.

BRIEF DESCRIPTION OF DRAWINGS

The above, and other aspects, features, and advantages of the present disclosure will be more clearly understood from the following detailed description when taken in conjunction with the accompanying drawings, in which.

Figure 1:
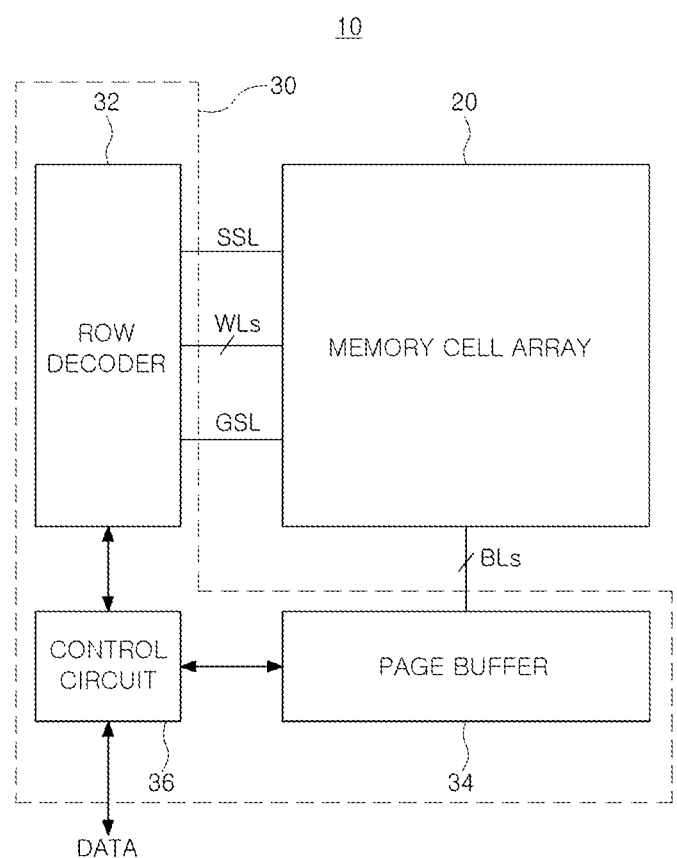
FIG. 1 is a schematic block diagram of a semiconductor device, according to example embodiments.

In the drawings, the size and relative sizes of layers and regions may be exaggerated for clarity. Like numbers refer to like elements throughout. Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

FIG. 1 is a schematic block diagram of a semiconductor device, according to example embodiments.

Referring to FIG. 1, a semiconductor device 10 may include a memory cell array 20 and a control logic 30. The semiconductor device 10 may be in the form of, for example, a semiconductor chip or die, formed from a semiconductor wafer. The term "semiconductor device" as used herein may also refer to a semiconductor package, including a package substrate, one or more semiconductor chips, and an encapsulant.

The memory cell array 20 may include a plurality of memory blocks, and each of the memory blocks may include a plurality of memory cells. The memory cells may be connected to a row decoder 32 via a string select line SSL, a plurality of word lines WLs and a ground select line GSL, and may be connected to a page buffer 34 via bit lines BLs. In example embodiments, a plurality of memory cells arranged in a single row may be connected to a single word line WL, and a plurality of memory cells arranged in a single column may be connected to a single bit line BL.

The control logic 30 may include the row decoder 32, the page buffer 34, and a control circuit 36.

The row decoder 32 may decode an input address to generate and transmit driving signals for the word lines WLs. The row decoder 32 may respectively provide a word line voltage generated from a voltage generating circuit in the control circuit 36, in response to control of the control circuit 36, to a selected word line WL and unselected word lines WLs.

The page buffer 34 may be connected to the memory cell array 20 via bit lines BLs to read information stored in the memory cells. The page buffer 34 may temporarily store data to be stored in the memory cells, or may sense data stored in the memory cells, according to an operation mode. The page buffer 34 may include a column decoder and a sense amplifier. The column decoder may selectively activate the bit lines BLs of the memory cell array 20, and the sense amplifier may sense a voltage from a bit line BL selected by the column decoder during a reading operation to read data stored in a selected memory cell.

The control circuit 36 may control operations of the row decoder 32 and the page buffer 34. The control circuit 36 may receive an external control signal and an external voltage, and may operate in response to the received control signal. The control circuit 36 may include the voltage generating circuit that generates voltages required for internal operations, for example, a program voltage, a read voltage, an erase voltage, and the like, using the external voltage. The control circuit 36 may control reading, writing, and/or erasing operations, in response to the control signals. Further, the control circuit 36 may include an input/output (I/O) circuit. The I/O circuit may receive data DATA and transfer DATA to the page buffer 34 in a program operation, and may externally output DATA received from the page buffer 34 in a reading operation.

Figure 2:
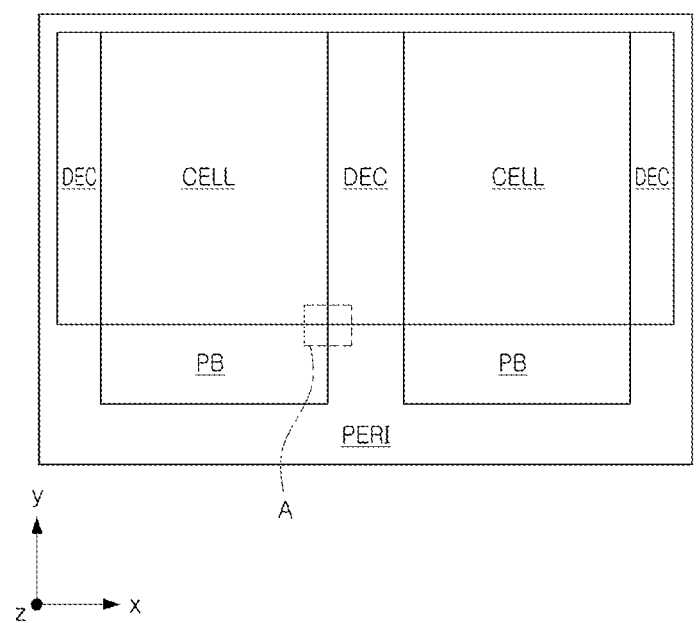
FIG. 2 is a schematic layout diagram of a semiconductor device, according to example embodiments.

FIG. 2 is a schematic layout diagram of a semiconductor device, according to example embodiments.

Referring to FIG. 2, a semiconductor device 10 may include a memory cell region CELL, and a row decoder region DEC, a page buffer region PB, and other circuit regions PERI which form a peripheral circuit region.

The memory cell region CELL may be a region in which the memory cell array 20 described above with reference to FIG. 1 is disposed. The row decoder region DEC may have the row decoder 32 of FIG. 1 disposed therein. The page buffer region PB may have the page buffer 34 of FIG. 1 disposed therein. The other circuit regions PERI may have other circuits including the control circuit 36 of FIG. 1 disposed therein. The arrangement relationships of the respective regions illustrated in FIG. 2 are provided by way of example, but an arrangement of the respective regions is not limited thereto.

According to certain embodiments, the row decoder region DEC may be disposed on at least one side of the memory cell region CELL in one direction thereof, for example, an x direction. The page buffer region PB may be disposed on at least one side of the memory cell region CELL in one direction thereof, for example, in a y direction. Thus, the word lines WLs (refer to FIG. 1) may extend in the x direction from the memory cell region CELL toward the row decoder region DEC, and the bit lines BLs (refer to FIG. 1) may extend in the y direction from the memory cell region CELL toward the page buffer region PB.

The other circuit regions PERI may be disposed in the vicinity of the memory cell region CELL, the row decoder region DEC, and the page buffer region PB, and an I/O circuit, a high voltage generating circuit, a circuit for testing, or the like may be disposed in the other circuit regions PERI.

Figure 3:
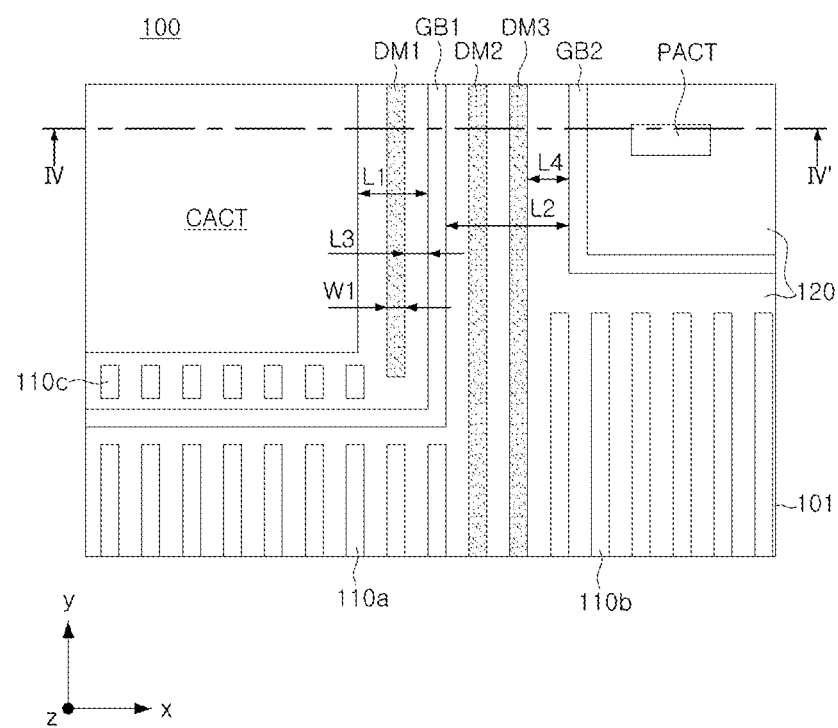
FIG. 3 is a schematic layout diagram of a semiconductor device, according to example embodiments.
Figure 4:
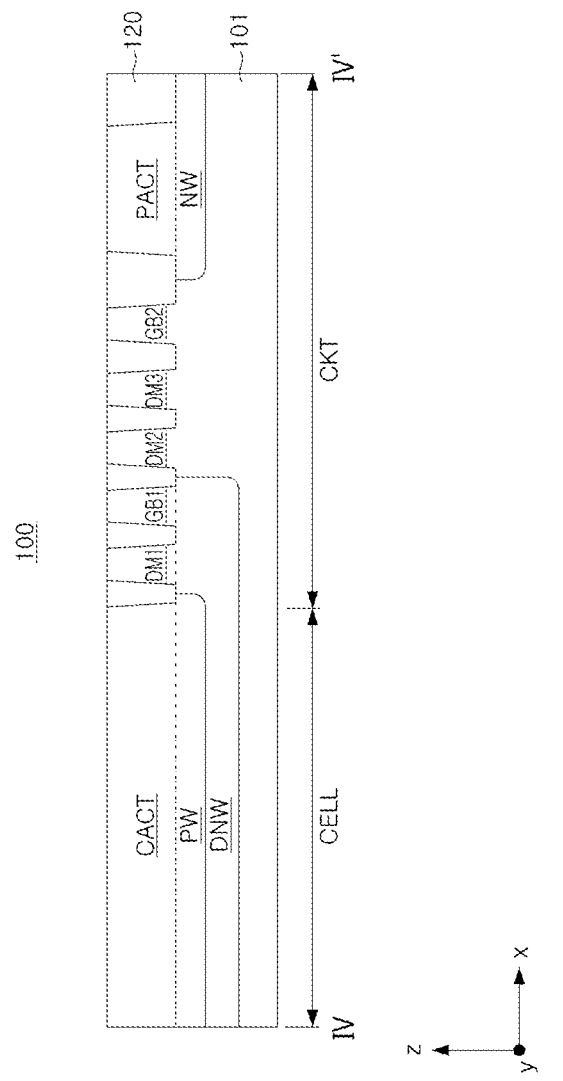
FIG. 4 is a schematic cross-sectional view taken along line IV-IV' of FIG. 3.

FIG. 3 is a schematic layout diagram of a semiconductor device, according to example embodiments. FIG. 3 is an enlarged view of region "A" of FIG. 2. FIG. 4 is a schematic cross-sectional view taken along line IV-IV' of FIG. 3.

Referring to FIGS. 3 and 4, a semiconductor device 100 may include a substrate 101 that has a memory cell region CELL as a first region and a peripheral circuit region CKT as a second region, and device isolation regions 120 disposed within the substrate 101 in the peripheral circuit region CKT to define active regions of the substrate 101. The memory cell region CELL may be the same region as the memory cell region CELL illustrated in FIG. 2, and the peripheral circuit region CKT may be a region that includes the row decoder region DEC, the page buffer region PB, and the other circuit regions PERI illustrated in FIG. 2. The memory cell region CELL includes memory cells, each memory cell configured to store one or more bits of data. The memory cells in the memory cell region CELL are used for reading and writing data to the semiconductor device 100 by storing data, and are configured to be accessed by one or more portions of the other circuit regions PERI, in order to communicate the data to or from an external device, such as an external controller or a host external to the semiconductor device 100. Each memory cell may include an active region and a storage element, as well as a gate used for accessing the memory cell. FIGS. 3 and 4 illustrate a region that includes a boundary between the memory cell region CELL and the peripheral circuit region CKT on a corner of the memory cell region CELL (e.g., as viewed from a plan view), for example, at an edge region of the memory cell region CELL. For convenience of description, the boundary between the memory cell region CELL and the peripheral circuit region CKT may be defined by a boundary of a cell active region CACT (e.g., a border beyond which memory cells of the memory cell region are no longer disposed).

The active regions of the semiconductor device 100 may include the cell active region CACT disposed in the memory cell region CELL, first and second guard active regions GB1 and GB2, first to third dummy active regions DM1 to DM3, and a circuit active region PACT disposed in the peripheral circuit region CKT, and first to third active regions 110a to 110c. Each of these active regions, as shown in FIG. 4, for example, may be located at the same vertical height. In the present specification, the term "dummy" is used to refer to a component present as a pattern having the same or similar structure and shape to other components without a practical function within a semiconductor device. For example, a dummy active region may not be connected to any gate or bit line for communicating within the semiconductor device 100, or a dummy active region may be connected to a dummy gate or dummy bit line in a way such that data associated with the active region is ignored by a peripheral circuit of the semiconductor device 100 or is not communicated to or from a device external to the semiconductor device 100, or is ignored by such an external device. Thus, dummy components as described herein are not used for communicating data used for logical operations or storage operations. FIGS. 3 and 4 only illustrate a configuration of the substrate 101 of the semiconductor device 100.

The substrate 101 may have an upper surface extending in the x- and y-axis directions. The substrate 101 may include a semiconductor material, for example, a Group IV semiconductor material, a Group III-V compound semiconductor material, or a Group II-VI oxide semiconductor material. For example, the Group IV semiconductor material may include silicon, germanium, or silicon-germanium. The substrate 101 may be a bulk wafer or an epitaxial layer.

The device isolation regions 120 may be formed of an insulating material. The device isolation regions 120 may be formed of, for example, an oxide, a nitride, or a combination thereof. The device isolation regions 120 may be formed using, for example, a shallow trench isolation (STI) process.

The cell active region CACT may extend to an entirety of the memory cell region CELL as illustrated in FIG. 2, and the memory cell region CELL may be formed as a single cell active region CACT. In one embodiment, the cell active region CACT is defined by boundaries of a first well (e.g., PW) formed at a bottom of the cell active region. The circuit active region PACT may be an active region of the peripheral circuit region CKT to form a transistor.

The first and second guard active region GB1 and GB2 may be disposed outside the memory cell region CELL in one direction, for example, the x direction. The first guard active region GB1 may surround the memory cell region CELL, and the second guard active region GB2 may surround a portion of the peripheral circuit region CKT. For example, the first guard active region GB1 may be spaced apart from the memory cell region CELL toward the peripheral circuit region CKT by a distance, with respect to the entirety of the memory cell region CELL having a quadrangular shape, to surround the memory cell region CELL. The second guard active region GB2 may, for example, surround an entirety or portion of the row decoder region DEC. Accordingly, each of the first and second guard active regions GB1 and GB2 may have a quadrangular ring shape. For example, each of the first and second guard active regions GB1 and GB2 may have a quadrangular strip shape that surrounds at least a portion of the memory cell region CELL and the row decoder region DEC. Each of the first and second guard active regions GB1 and GB2 may be referred to as a guard ring. Furthermore, each of the first and second guard active regions GB1 and GB2 may be connected to one or more plugs for connecting to a power source (e.g., positive voltage, negative voltage, or ground).

The first guard active region GB1 may be an active region closest to the memory cell region CELL, except for the first dummy active region DM1. The second guard active region GB2 may be an active region closest to the first guard active region GB1, except for the second and third dummy active regions DM2 and DM3. The second guard active region GB2 may at least surround a transistor (e.g., of the circuit active region PACT) closest to the memory cell region CELL in the x direction.

As illustrated in FIG. 4, the memory cell region CELL may include a first well PW that includes first conductivity-type impurities, and a portion of a second well DNW that surrounds the first well PW and includes second conductivity-type impurities. For example, the first conductivity-type may be p-type and the second conductivity-type may be n-type. The substrate 101 may include first conductivity-type impurities, whose concentration may be lower than that of the impurities included in the first well PW. The second well DNW may include and vertically overlap with the first guard active region GB1. In an example embodiment, at least a region of the first guard active region GB1 adjacent to the upper surface of the substrate 101 may include impurities having a concentration higher than the impurities included in a lower region of the second well DNW. The peripheral circuit region CKT may include a third well NW that contains second conductivity-type impurities, and may also include other wells that are disposed in other regions which are not illustrated and contain first conductivity-type impurities. The second guard active region GB2 may include impurities that have the same conductivity-type as the substrate 101. In example embodiments, at least a region of the second guard active region GB2 adjacent to the upper surface of the substrate 101 may include impurities having a concentration higher than the impurities included in a lower region of the substrate 101. In the present example embodiment, the first and second guard active regions GB1 and GB2 may include different conductivity-type impurities. However, the present inventive concept is not limited thereto.

In an example embodiment, the first well PW may also include a guard active region. The guard active region may be disposed in the memory cell region CELL, or may also be disposed between the first guard active region GB1 and the memory cell region CELL. In an example embodiment, the guard active region may also be adjacent to the other edge region, which is not illustrated, of the memory cell region CELL.

The first to third dummy active regions DM1 to DM3 may have a line shape extending in one direction and formed on a plane, for example, the y direction. The first to third dummy active regions DM1 to DM3 may be spaced apart from the boundary between the memory cell region CELL and the peripheral circuit region CKT, for example, an external surface of the cell active region CACT by distances, and the first to third dummy active regions DM1 to DM3 may extend along the external surface in at least one direction. The first to third dummy active regions DM1 to DM3 may be spaced apart from one another in the x direction, and may extend parallel to one another in the y direction.

The first dummy active region DM1 may be disposed between the memory cell region CELL and the first guard active region GB1 in the x direction, and the second and third dummy active regions DM2 and DM3 may be disposed between the first guard active region GB1 and the second guard active region GB2 in the x direction. An end of the first dummy active region DM1 may be, as illustrated in FIG. 3, disposed in a region surrounded by the first guard active region GB1. However, the present inventive concept is not limited thereto. In an example embodiment, the first dummy active region DM1 may also be bent along the first guard active region GB1 to extend in the x direction below the memory cell region CELL. The second and third dummy active regions DM2 and DM3 may extend farther than the first dummy active region DM1. However, the present inventive concept is not limited thereto.

A width W1 of the first to third dummy active regions DM1 to DM3 may range, for example, from 500 nm to 3 and may be substantially the same between one another. However, the present inventive concept is not limited thereto. A distance L1 between the cell active region CACT and the first guard active region GB1 may range, for example, from 1 μm to 7 μm. A distance L2 between the first guard active region GB1 and the second guard active region GB2 may range, for example, from 1 μm to 7 μm. In certain embodiments, L2 is greater than L1. A distance L3 between the first dummy active region DM1 and the first guard active region GB1 may be less than 3 μm, and a distance L4 between the third dummy active region DM3 and the second guard active region GB2 may also be less than 3 μm. In the present example embodiment, the first dummy active region DM1 may be disposed between the cell active region CACT and the first guard active region GB1, and the second and third dummy active regions DM2 and DM3 may be disposed between the first guard active region GB1 and the second guard active region GB2, so that lengths of the device isolation regions 120 therebetween in the x direction may be less than 3 μm. In certain embodiments, L1 is greater than L3 and L4. For this purpose, in example embodiments, the number of the first to third dummy active regions DM1 to DM3 may be modified, according to the distances L1 and L2 and the width W1. An arrangement of the first to third dummy active regions DM1 to DM3, as described above, may prevent a dishing effect from occurring in the device isolation regions 120 during a manufacturing process of the semiconductor device 100, and edge regions of the first guard active region GB1 and the second guard active region GB2 from being damaged. This will be described below in more detail, with reference to FIG. 9D.

The first to third active regions 110a to 110c may be disposed around the first and second guard active regions GB1 and GB2 in the peripheral circuit region CKT. The first to third active regions 110a to 110c may also correspond to dummy active regions. A size, shape, and arrangement of the first to third active regions 110a to 110c are not limited to those illustrated in the drawings, and may be modified according to example embodiments.

Figure 5:
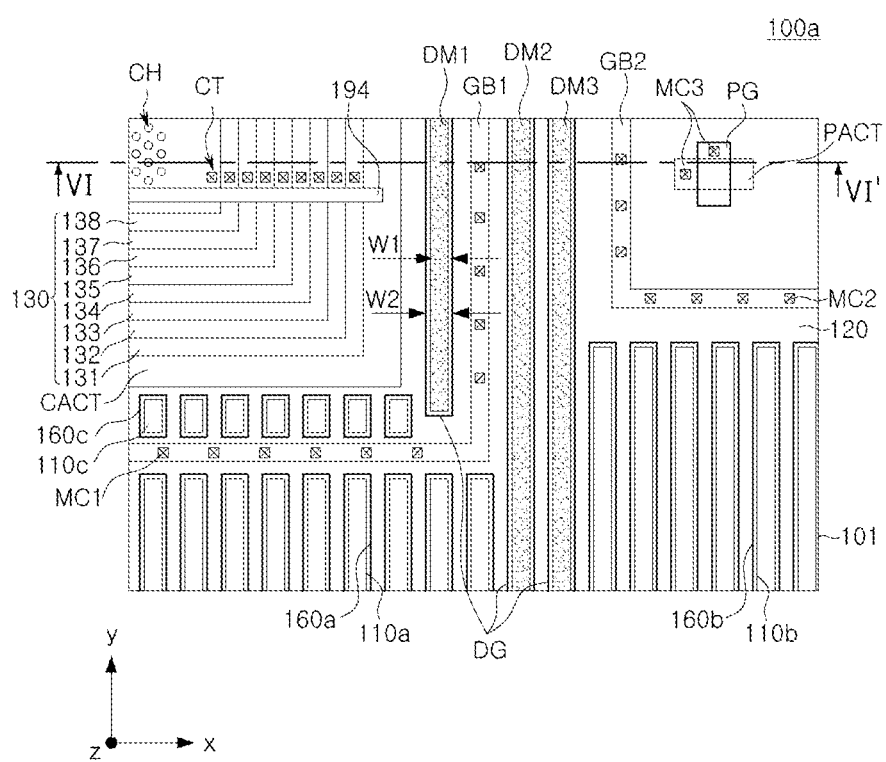
FIG. 5 is a schematic layout diagram of a semiconductor device, according to example embodiments.
Figure 6:
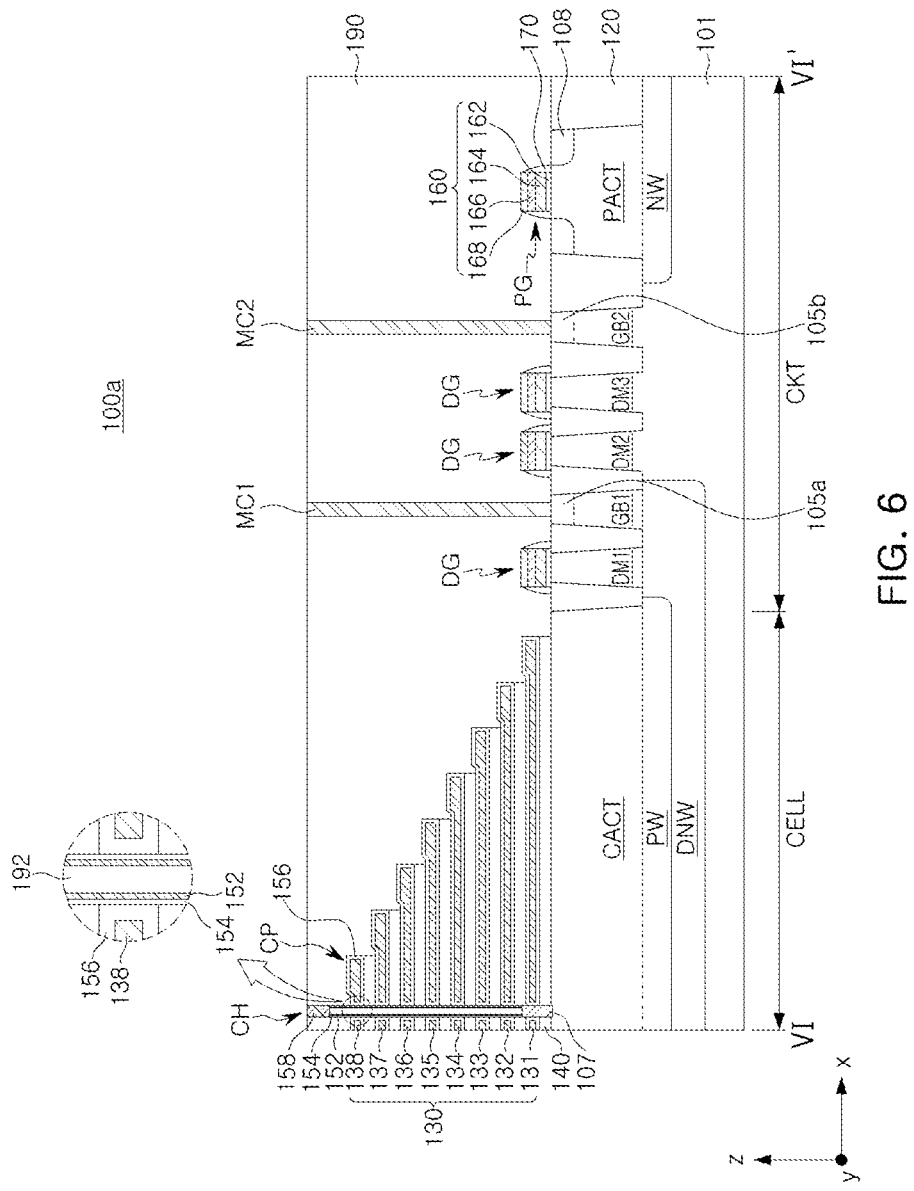
FIG. 6 is a schematic cross-sectional view taken along line VI-VI' of FIG. 5.

FIG. 5 is a schematic layout diagram of a semiconductor device, according to example embodiments. FIG. 5 only illustrates main components of the semiconductor device. FIG. 6 is a cross-sectional view taken along line VI-VI' of FIG. 5.

Referring to FIGS. 5 and 6, a semiconductor device 100a may include a substrate 101 that has a memory cell region CELL as a first region and a peripheral circuit region CKT as a second region, and device isolation regions 120 that define active regions of the substrate 101. Regarding the device isolation regions 120 and the active regions, the same description as above with reference to FIGS. 3 and 4, may be applied.

In the memory cell region CELL, the semiconductor device 100a may further include gate electrodes 131 to 138, collectively represented by a gate electrode stack 130 and stacked on the substrate 101 to form a gate electrode structure, channels CHs passing through the gate electrode stack 130, gate contacts CT connected to the gate electrodes of the gate electrode stack 130, and an isolation region 194 extending in an x direction through the gate electrode stack 130.

The gate electrodes 131 to 138 may be disposed along a side wall of each of the channels CHs, and may be spaced apart from one another in one direction perpendicular to the substrate 101. The gate electrode stack 130 may provide contact regions CP that extend to have different lengths toward a boundary of the memory cell region CELL to form stepped portions having a stepped shape. The gate electrode stack 130 may be connected to the gate contacts CT in the contact regions CP to be connected to an upper wiring structure. As illustrated in FIG. 6, each gate electrode of the gate electrode stack 130 may have a shape whose thickness increases at an end portion, such that the gate electrodes of the gate electrode stack 130 may be stably connected to the gate contacts CT. However, the present inventive concept is not limited thereto.

The gate electrodes 131 to 138 may form a gate of a ground select transistor (GST), a plurality of memory cells (MCs), and a string select transistor (SST). The gate electrode stack 130 may extend to form the WLs, the SSL, and the GSL of FIG. 1, and the WLs may be commonly connected to adjacent memory cell strings arranged in the x direction and a y direction in predetermined units. According to an example embodiment, the gate electrode of an uppermost SST and a lowermost GST may be provided in an amount of one, or two or more, respectively, and may have the same or different structure from the gate electrode of each of the MCs. A portion of the gate electrode stack 130, for example, the gate electrode adjacent to the gate electrode of the GST or the SST, may be a dummy gate electrode.

The gate electrodes of the gate electrode stack 130 may include a metal material, for example, tungsten (W). According to an example embodiment, the gate electrode stack 130 may include polycrystalline silicon or a metal silicide doped or undoped with impurities. In example embodiments, the gate electrodes of the gate electrode stack 130 may further include a diffusion barrier layer.

A plurality of interlayer insulating layers 140 may be disposed between the gate electrodes 131 to 138. The interlayer insulating layers 140 may also be spaced apart from one another in a z direction, and may extend in the x direction, similarly to the gate electrodes of the gate electrode stack 130. The interlayer insulating layers 140 may include an insulating material, such as a silicon oxide or a silicon nitride.

The channels CHs may be disposed in rows and columns on the substrate 101, and may be spaced apart from one another. For example, the channels CHs may be disposed to form a grid pattern, or a zigzag pattern in one direction. The channels CHs may have an inclined side wall that narrows toward the substrate 101 according to an aspect ratio of the channels CHs. Each of the channels CHs may have a channel region 152 disposed therein. The channel region 152 may have an annular shape that surrounds a channel insulating layer 192 therein, and may also have a columnar shape, such as a cylinder or a prism, without the channel insulating layer 192, according to an example embodiment. The channel region 152 may connect to an epitaxial layer 107 at a lower portion thereof. The channel region 152 may include a semiconductor material, such as polycrystalline silicon or single crystalline silicon, and the semiconductor material may be undoped with impurities, or may include p-type or n-type impurities. The channels CHs arranged in a straight line in the x direction may be connected to different BLs, respectively, according to an arrangement of the upper wiring structure connected to channel pads 158. Further, a portion of the channels CHs may be a dummy channel that is not connected to the BLs.

First and second gate dielectric layers 154 and 156 may be disposed between each gate electrode of the gate electrode stack 130 and the channel region 152. Each of the first and second gate dielectric layers 154 and 156 may include at least one of a tunneling layer, a charge storage layer, and a blocking layer sequentially stacked from the channel region 152. The first gate dielectric layer 154 may extend vertical to the substrate 101 as in the channel region 152, and the second gate dielectric layer 156 may surround each gate electrode of the gate electrode stack 130. For example, the first gate dielectric layer 154 may include the tunneling layer and the charge storage layer, and the second gate dielectric layer 156 may include at least a portion of the blocking layer. However, the first and second gate dielectric layers 154 and 156 may be modified according to example embodiments. Further, in example embodiments, the first gate dielectric layer 154 may include all of the tunneling layer, the charge storage layer, and the blocking layer. Here, the second gate dielectric layer 156 may be omitted.

The epitaxial layer 107 may be disposed on the substrate 101 on a lower end of each of the channels CHs, and may be disposed on side surfaces of at least one of the gate electrodes 131 to 138. The epitaxial layer 107 may be formed in a recessed region of the substrate 101. An upper surface of the epitaxial layer 107 may be higher than an upper surface of the lowermost gate electrode 131, and may be lower than a lower surface of the gate electrode 132 disposed above the lowermost gate electrode 131. However, the epitaxial layer 107 is not limited to that illustrated in FIG. 6. Even when the aspect ratio of the channels CHs is increased, the channel region 152 may be stably and electrically connected to the substrate 101 by the epitaxial layer 107, and characteristics of the GST between the memory cell strings may be uniform by the epitaxial layer 107. In example embodiments, the epitaxial layer 107 may be omitted. Here, the channel region 152 may be directly connected to the substrate 101.

Each of the channel pads 158 may be disposed on the channel region 152 in each of the channels CHs. Each of the channel pads 158 may cover the upper surface of the channel insulating layer 192, and may be electrically connected to the channel region 152. The channel pads 158 may include, for example, polycrystalline silicon doped with impurities.

The isolation region 194 may be, as illustrated in FIG. 5, disposed between the channels CHs at intervals, and may be connected to the substrate 101 through the gate electrode stack 130 and the interlayer insulating layers 140. The isolation region 194 may have a line shape extending in the x direction, and may include a common source line (CLS).

In the peripheral circuit region CKT, the semiconductor device 100a may further include a circuit gate electrode PG disposed on the circuit active region PACT, dummy gate electrodes DG disposed on the first to third dummy active regions DM1 to DM3, first to third gate regions 160a to 160c disposed on the first to third active regions 110a to 110c, and first to third contact plugs MC1 to MC3 connected to the first and second guard active regions GB1 and GB2 and the circuit active region PACT.

The circuit gate electrode PG may intersect the circuit active region PACT in a region of the substrate 101 surrounded by the second guard active region GB2. The circuit active region PACT and the circuit gate electrode PG may form a transistor. The transistor may be the closest transistor of the peripheral circuit region CKT to the boundary of the memory cell region CELL. As illustrated in FIG. 6, the circuit gate electrode PG may include a gate stack structure 160 that includes a circuit gate insulating layer 162 and first to third circuit electrode layers 164 to 168 sequentially stacked on the substrate 101.

The circuit gate insulating layer 162 may include an insulating material, such as a silicon dioxide ($SiO_2$). The first to third circuit electrode layers 164 to 168 may be formed of a conductive material, may be formed of different materials, or may be formed using different processes. For example, the first and second circuit electrode layers 164 and 166 may be formed of polycrystalline silicon, and the third circuit electrode layer 168 may be formed of a metal or a metal silicide. In example embodiments, a configuration of the first to third circuit electrode layers 164 to 168 is not limited thereto, and the number and a material of the first to third circuit electrode layers 164 to 168 may be modified. Spacer layers 170 may be disposed on opposing side surfaces of the gate stack structure 160, and may include, for example, a silicon nitride or a silicon oxide. Impurity regions 108 may be disposed in the substrate 101 on the opposing side surfaces of the gate stack structure 160. The impurity regions 108 may include, for example, first conductivity-type impurities different from a third well NW, and may function as a drain/source region of the transistor. The circuit active region PACT and the circuit gate electrode PG may have the third contact plugs MC3 connected thereto.

The dummy gate electrodes DG may be disposed on the first to third dummy active regions DM1 to DM3. The dummy gate electrodes DG may have a shape that is dependent on a pattern of the first to third dummy active regions DM1 to DM3, and may extend in the y direction. Thus, a portion of the dummy gate electrodes DG may be disposed between the boundary of the memory cell region CELL, having the gate electrode structure disposed therein, and the first guard active region GB1, and the other portion of the dummy gate electrodes DG may be disposed between the first guard active region GB1 and the second guard active region GB2. A width W2 of the dummy gate electrodes DG may be greater than a width W1 of the first to third dummy active regions DM1 to DM3. However, the present inventive concept is not limited thereto. In example embodiments, the width W2 of the dummy gate electrodes DG may also be the same as the width W1 of the first to third dummy active regions DM1 to DM3. The dummy gate electrodes DG may have a structure of the gate stack structure 160, and may further include the spacer layers 170 disposed on the opposing side surfaces of the gate stack structure 160. The dummy gate electrodes DG may not be connected to contact plugs, and/or may have no impurity regions 108 disposed adjacent thereto, unlike in the circuit gate electrode PG. Thus, in certain embodiments, the dummy gate electrodes DG as well as the dummy active regions DM1 to DM3 are not configured to function as transistors.

As illustrated in FIG. 5, the first to third gate regions 160a to 160c may be disposed on the first to third active regions 110a to 110c, and may have a width greater than the first to third active regions 110a to 110c. The first to third gate regions 160a to 160c may each be a dummy gate electrode such as the dummy gate electrode DG. The first to third gate regions 160a to 160c may have the same structure as the gate stack structure 160, and the spacer layers 170 may be formed on opposing side surfaces of each of the first to third gate regions 160a to 160c. In example embodiments, a size, shape, and arrangement of the first to third gate regions 160a to 160c may be modified, and the first to third gate regions 160a to 160c may have an arrangement different from the first to third active regions 110a to 110c.

The first and second contact plugs MC1 and MC2 may be connected to the first and second guard active regions GB1 and GB2, respectively. Plug doping regions 105a and 105b including impurities may be disposed within the substrate 101 to which the first and second contact plugs MC1 and MC2 are connected. The plug doping region 105a disposed below the first contact plug MC1 may include a relatively high concentration of impurities having the same conductivity-type as impurities included in a second well DNW, and the plug doping region 105b disposed below the second contact plug MC2 may include a relatively high concentration of impurities having the same conductivity-type as impurities included in the substrate 101. In example embodiments, the plug doping regions 105a and 105b may also be omitted. Nonetheless, the first and second guard active regions GB1 and GB2 differ from the first to third dummy active regions DM1 to DM3 at least in that the first and second guard active regions are connected to first and second contact plugs MC1 and MC2 (e.g., for connecting to a power source), and include optional plug doping regions 105a and 105b. In certain embodiments, the dummy active regions DM1 to DM3 are not connected to contact plugs and do not include plug doping regions.

Figure 7:
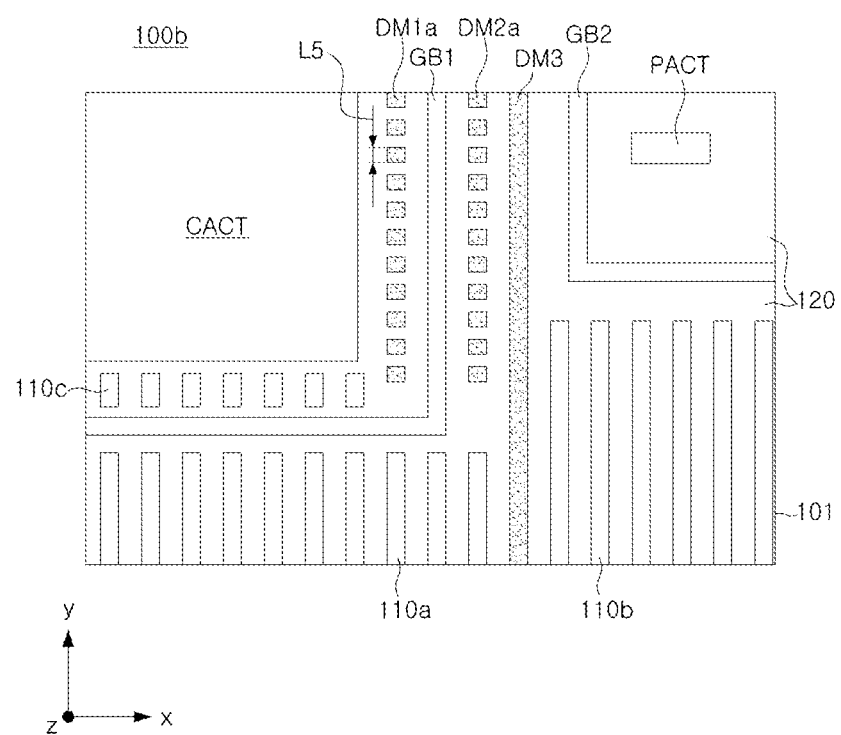
FIGS. 7 and 8 are schematic layout diagrams of semiconductor devices, according to example embodiments.
Figure 8:
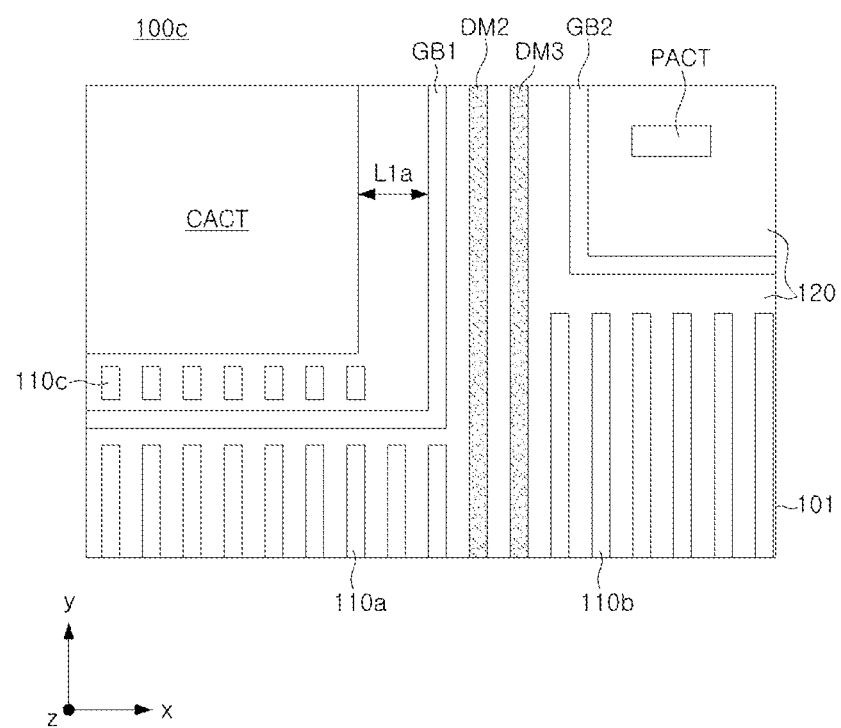

FIGS. 7 and 8 are schematic layout diagrams of semiconductor devices, according to example embodiments.

Referring to FIG. 7, a semiconductor device 100b may include first and second dummy active regions DM1a and DM2a, each of which includes a plurality of quadrangular patterns, unlike in the example embodiments of FIGS. 3 and 5. Each of the first and second dummy active regions DM1a and DM2a, according to the present example embodiment, may include the quadrangular patterns disposed in a row in a y direction. Each of the quadrangular patterns may be square or rectangular. In example embodiments, a length L5 of the quadrangular patterns forming each of the first and second dummy active regions DM1a and DM2a may be modified. In example embodiments, each of the first and second dummy active regions DM1a and DM2a may also include quadrangular patterns having different lengths.

Referring to FIG. 8, a semiconductor device 100c may not include the first dummy active regions DM1 and DM1a (refer to FIGS. 3, 5, and 7), unlike in the example embodiments of FIGS. 3, 5, and 7. For example, a dummy active region may not be disposed between a cell active region CACT and a first guard active region GB1 in an x direction. Here, a distance L1a between the cell active region CACT and the first guard active region GB1 may be less than, for example, 3 µm, but is not limited thereto. In the present example embodiment, second and third dummy active regions DM2 and DM3 disposed between the first guard active region GB1 and a second guard active region GB2 may increase density of an active region between the cell active region CACT and a circuit active region PACT to prevent the above-mentioned dishing effect from occurring, even when a dummy active region is not disposed between the cell active region CACT and the first guard active region GB1. In an example embodiment, a third active region 110c may also be omitted.

FIGS. 9A through 9I are schematic cross-sectional views illustrating a method of manufacturing a semiconductor device, according to example embodiments. FIGS. 9A through 9I illustrate regions corresponding to the regions illustrated in FIG. 6.

Figure 9A:
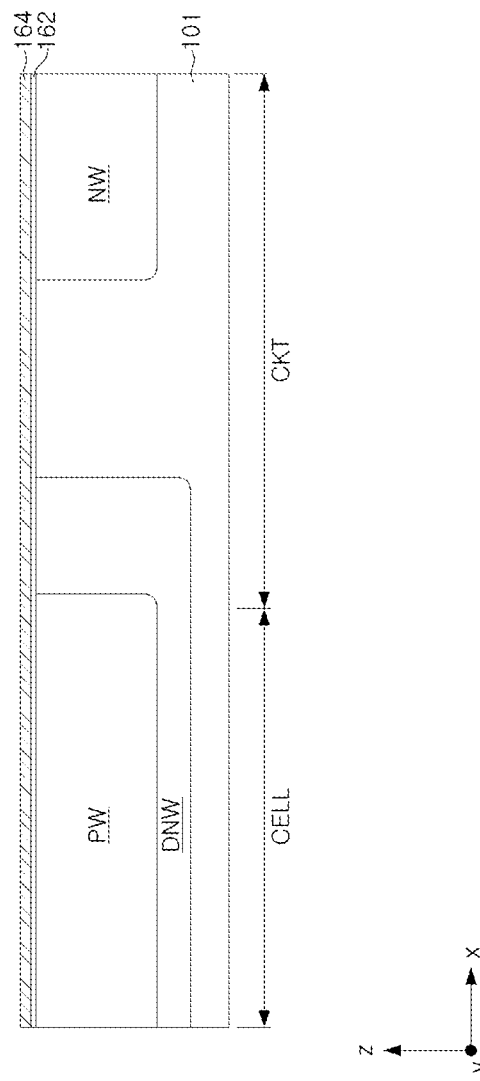
FIGS. 9A through 9I are schematic cross-sectional views illustrating a method of manufacturing a semiconductor device, according to example embodiments.

Referring to FIG. 9A, first to third wells PW, DNW, and NW may be formed in a substrate 101, and a circuit gate insulating layer 162 and a first circuit electrode layer 164 may be formed on the substrate 101.

The first to third wells PW, DNW, and NW may be formed by injecting impurities into the substrate 101, using an ion implantation process. The first well PW may be formed by injecting first conductivity-type impurities (e.g., p-type) into the substrate 101, and the second and third wells DNW and NW may be formed by injecting second conductivity-type impurities (e.g., n-type) into the substrate 101. The second and third wells DNW and NW may include the impurities having different concentrations. A peripheral circuit region CKT may include various conductivity-types of wells, and wells disposed in a region which is not illustrated and including first conductivity-type impurities may be formed in the present process stage.

The circuit gate insulating layer 162 and the first circuit electrode layer 164 may be sequentially formed on the substrate 101. The circuit gate insulating layer 162 and the first circuit electrode layer 164 may be formed using an atomic layer deposition (ALD) or a chemical vapor deposition (CVD) process.

The peripheral circuit region CKT may include a region in which high voltage transistors are disposed, and a region in which low voltage transistors are disposed. Prior to forming the circuit gate insulating layer 162, a process of removing a portion of an upper portion of the substrate 101 in the region in which high voltage transistors are disposed may be performed. In this case, the circuit gate insulating layer 162 may be formed to have different thicknesses in the region in which high voltage transistors are disposed and in the region in which low voltage transistor are disposed. The circuit gate insulating layer 162 may be formed for example of a silicon oxide, and the first circuit electrode layer 164 may be formed for example of polycrystalline silicon. However, the present inventive concept is not limited thereto.

Figure 9B:
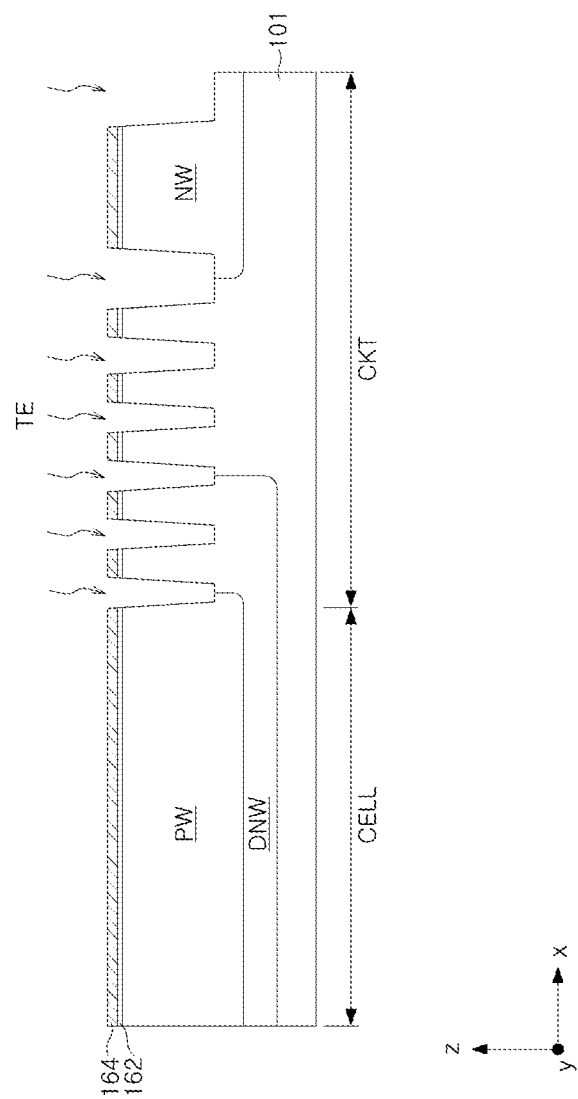

Referring to FIG. 9B, portions of the circuit gate insulating layer 162, the first circuit electrode layer 164, and the substrate 101 may be removed to form trenches TE.

Using an additional mask layer, a region in which the trenches TE are to be formed may be exposed. Then, the trenches TE may be formed using an etching process. The trenches TE may be formed using an anisotropic etching process, for example, a plasma etching process. A depth of the trenches TE may vary according to characteristics of a semiconductor device, and may range, for example, from 2,000 Å to 7,000 Å. A side wall of the trenches TE may not be perpendicular to an upper surface of the substrate 101. For example, a width of the trenches TE may be reduced toward a lower surface of the substrate 101. However, the present inventive concept is not limited thereto. Subsequent to forming the trenches TE, an additional ion implantation process for reinforcing insulating properties may be performed.

Figure 9C:
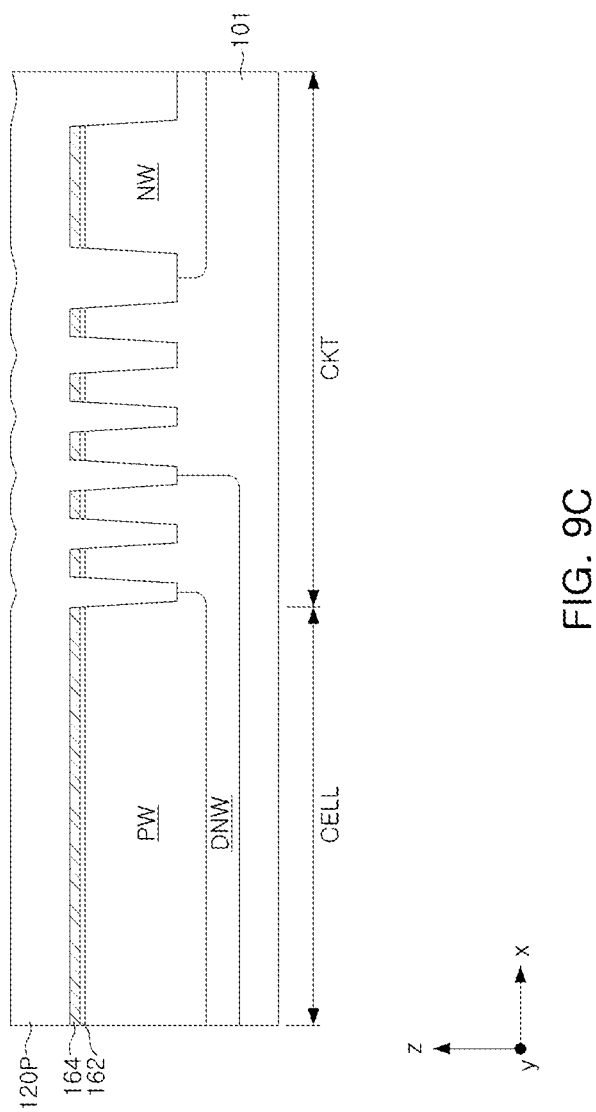

Referring to FIG. 9C, a device isolation layer 120P may be formed to fill the trenches TE.

The device isolation layer 120P may include an oxide, for example, at least one of a high temperature oxide (HTO), a high density plasma (HDP) oxide, tetraethyl orthosilicate (TEOS), borophosphosilicate glass (BPSG), and undoped silicate glass (USG). For example, the device isolation layer 120P may include an upper TEOS layer and a lower USG layer. The device isolation layer 120P may have a sufficiently increased thickness to entirely fill the trenches TE. Subsequent to forming the device isolation layer 120P, an additional annealing process for highly densifying the device isolation layer 120P may be performed.

In an example embodiment, a trench liner layer may also be formed inside each of the trenches TE, prior to forming the device isolation layer 120P. The trench liner layer may include, for example, a silicon oxide or a silicon nitride.

Figure 9D:
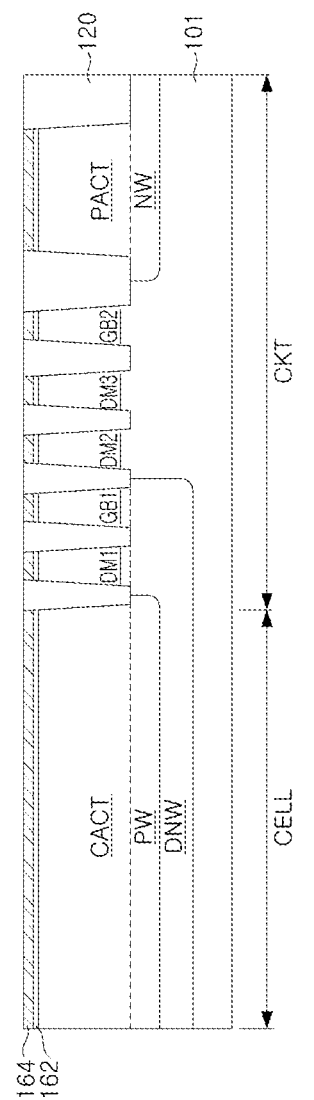

Referring to FIG. 9D, a planarization process of allowing the device isolation layer 120P to only fill the trenches TE may be performed to form device isolation regions 120.

The planarization process may be, for example, a chemical mechanical polishing (CMP) process. The planarization process may be performed using the first circuit electrode layer 164 as a CMP stop layer, and a portion of the first circuit electrode layer 164 may be polished and removed during the planarization process.

Subsequent to the planarization process, the device isolation regions 120 filling the trenches TE may be formed. The device isolation regions 120 may define active regions of the substrate 101, such as a cell active region CACT, a circuit active region PACT, a first guard active region GB1, a second guard active region GB2, a first dummy active region DM1, a second dummy active region DM2, and a third dummy active region DM3. The first to third dummy active regions DM1 to DM3 may prevent a dishing effect from occurring between the cell active region CACT and the first guard active region GB1 and between the first guard active region GB1 and the second guard active region GB2 during the planarization process.

Figure 9E:
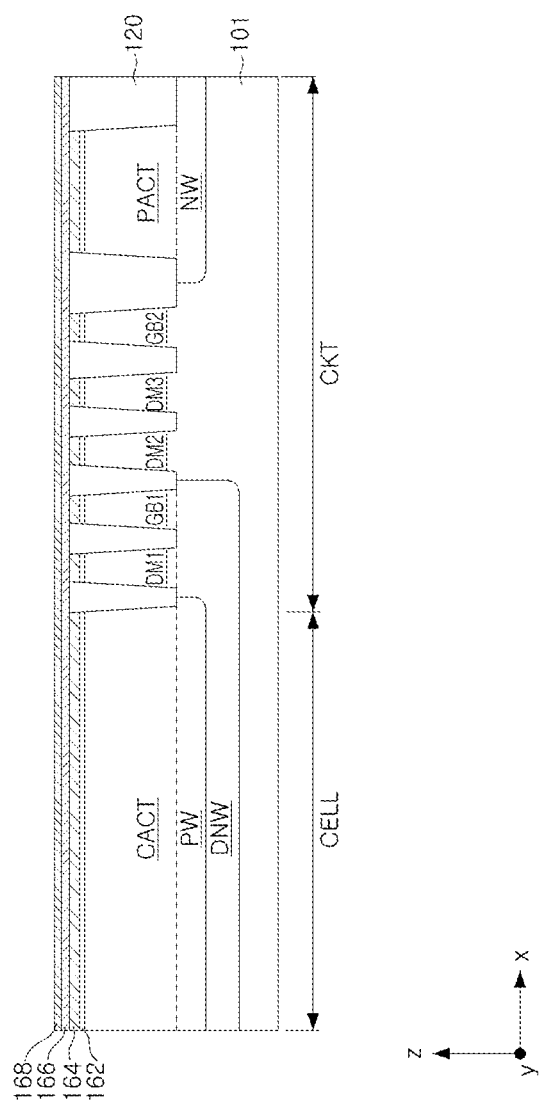

Referring to FIG. 9E, second and third circuit electrode layers 166 and 168 may be sequentially formed on the first circuit electrode layer 164 and the device isolation regions 120.

The second circuit electrode layer 166 may be formed of polycrystalline silicon, and the third circuit electrode layer 168 may be formed of a metal or a metal silicide. However, the present inventive concept is not limited thereto. For example, the third circuit electrode layer 168 may include a tungsten silicide layer.

Figure 9F:
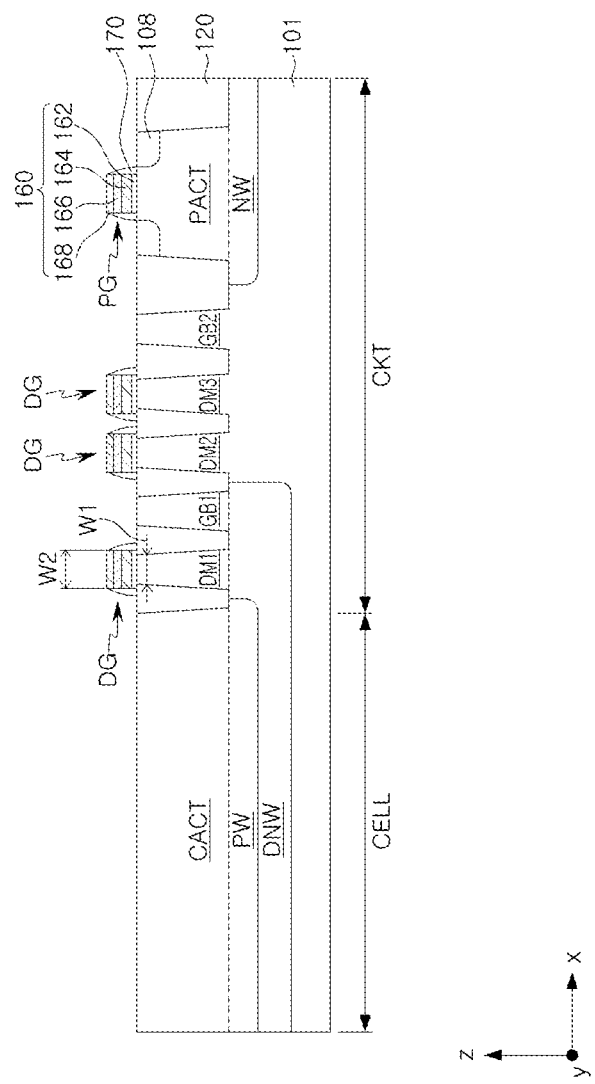

Referring to FIG. 9F, the circuit gate insulating layer 162 and the first to third circuit electrode layers 164 to 168 may be patterned to form a gate stack structure 160, and spacer layers 170 and impurity regions 108 may be formed on opposing sides of the gate stack structure 160.

Using an additional mask layer, portions of the circuit gate insulating layer 162 and the first to third circuit electrode layers 164 to 168 may be removed using an etching process to form the gate stack structure 160. Subsequently, the spacer layers 170 may be formed on the opposing side walls of the gate stack structure 160. According to example embodiments, the spacer layers 170 may also include a plurality of layers.

Subsequently, an ion implantation process may be performed to form the impurity regions 108. According to example embodiments, the impurity regions 108 may be formed in other process stages, and may also be formed using an ion implantation process after forming a mask, such that regions including the memory cell region CELL may not be exposed. In example embodiments, impurity regions may be formed in the first and second guard active regions GB1 and GB2 in the present process stage.

In the present process stage, a circuit gate electrode PG and dummy gate electrodes DG each including the gate stack structure 160 may be formed. A width W2 of the dummy gate electrodes DG in the x direction may be greater than a width W1 of the first to third dummy active regions DM1 to DM3. However, the present inventive concept is not limited thereto.

Figure 9G:
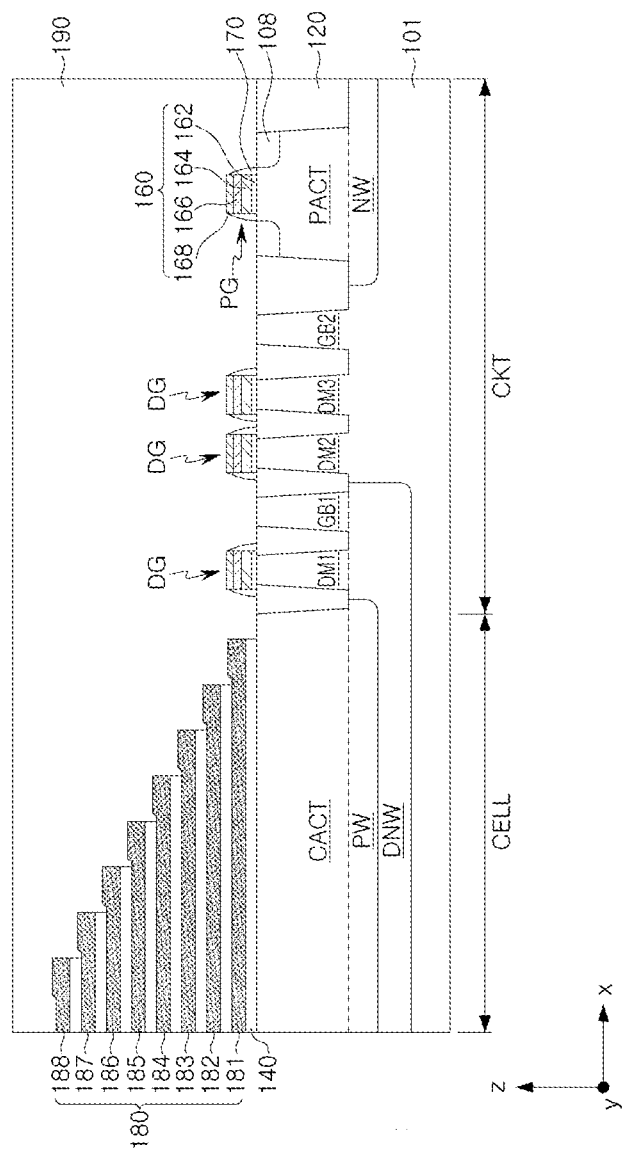

Referring to FIG. 9G, sacrificial layers 181 to 188 collectively represented by a sacrificial layer stack 180 and interlayer insulating layers 140 may be alternately stacked on the substrate 101, and portions of the sacrificial layer stack 180 and the interlayer insulating layers 140 may be removed, such that the sacrificial layers 181 to 188 may extend in the memory cell region CELL to have different lengths in the x direction.

The sacrificial layer stack 180 may be replaced by a gate electrode stack 130 through a subsequent process. The sacrificial layer stack 180 may be formed of a material that may be etched with etch selectivity with respect to the interlayer insulating layers 140. For example, the interlayer insulating layers 140 may include at least one of a silicon oxide or a silicon nitride, and the sacrificial layer stack 180 may be formed of a material selected from silicon, a silicon oxide, a silicon carbide, and a silicon nitride and different from the interlayer insulating layers 140. In example embodiments, all of thicknesses of the interlayer insulating layers 140 may not be the same. The thickness and number of the interlayer insulating layers 140 and the sacrificial layers 181 to 188 may be modified. Prior to or during forming the sacrificial layer stack 180 and the interlayer insulating layers 140, an additional insulating layer may be formed in the peripheral circuit region CKT to cover the circuit gate electrode PG and the dummy gate electrodes DG.

A photolithography process and an etching process for the sacrificial layer stack 180 may be repeated, such that an upper sacrificial layer of the sacrificial layer stack 180 may extend to have a length shorter than a lower sacrificial layer of the sacrificial layer stack 180. Accordingly, the sacrificial layer stack 180 may have a stepped shape. Subsequently, a process of forming the sacrificial layer stack 180 to have a relatively increased thickness at an end portions of each sacrificial layer thereof may be performed.

Subsequently, an upper insulating layer 190 may be formed to cover an upper surface of a stack structure of the sacrificial layer stack 180 and the interlayer insulating layers 140. In the peripheral circuit region CKT, the upper insulating layer 190 may include a plurality of layers.

Figure 9H:
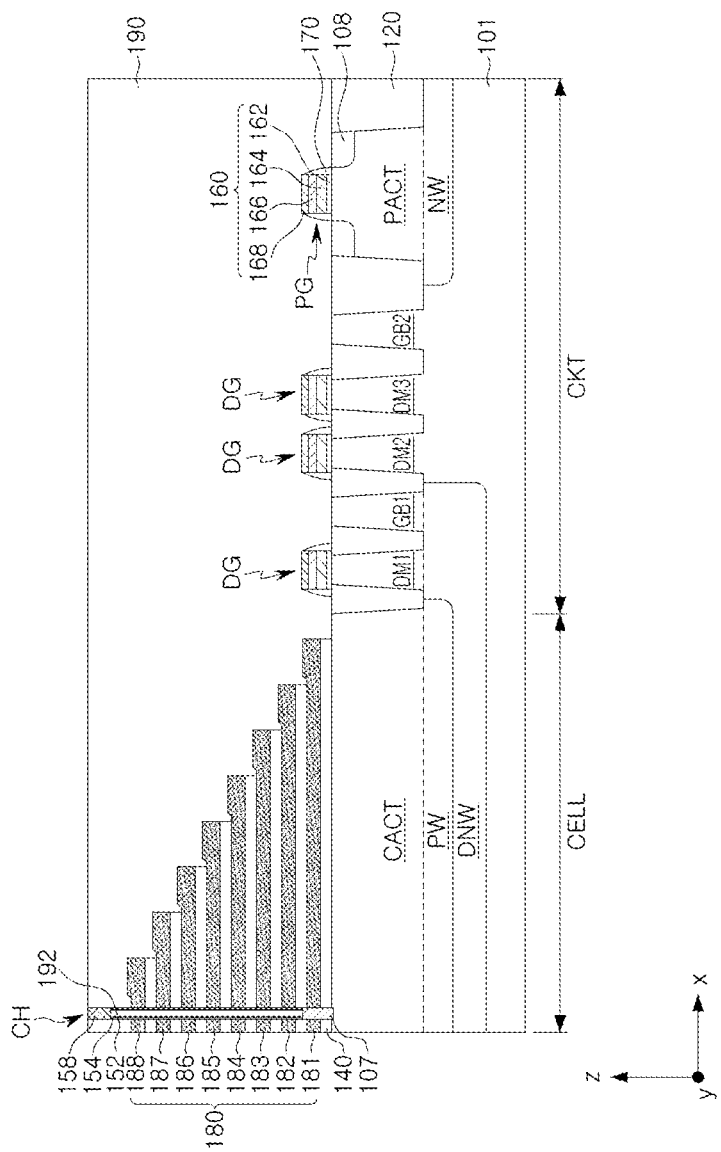

Referring to FIG. 9H, channels CHs may be formed through the stack structure of the sacrificial layer stack 180 and the interlayer insulating layers 140 in the memory cell region CELL. Subsequently, an epitaxial layer 107, a first gate dielectric layer 154, a channel region 152, a channel insulating layer 192, and a channel pad 158 may be formed in each of the channels CHs.

The channels CHs may be formed by anisotropically etching portions of the sacrificial layer stack 180 and the interlayer insulating layers 140, and may have a hole shape. Due to a thickness of the stack structure, a side wall of the channels CHs may not be perpendicular to the upper surface of the substrate 101. In example embodiments, the channels CHs may recess a portion of the substrate 101. A portion of the channels CHs may be a dummy channel, and dummy channels may be formed even in a region in which the sacrificial layers 181 to 188 extend to have different lengths.

The epitaxial layer 107 may be formed using a selective epitaxial growth (SEG) process. The epitaxial layer 107 may include a single layer or a plurality of layers. The epitaxial layer 107 may include polycrystalline silicon, single crystalline silicon, polycrystalline germanium, or single crystalline germanium doped or undoped with impurities. The first gate dielectric layer 154 may be formed to have a uniform thickness, using an ALD or a CVD process. The channel region 152 may be formed on the first gate dielectric layer 154 within each of the channels CHs. The channel insulating layer 192 may be formed to fill each of the channels CHs, and may be an insulating material. In example embodiments, a conductive material, rather than the channel insulating layer 192, may fill a space within the channel region 152. The channel pad 158 may be formed of a conductive material, for example, polycrystalline silicon.

Figure 9I:
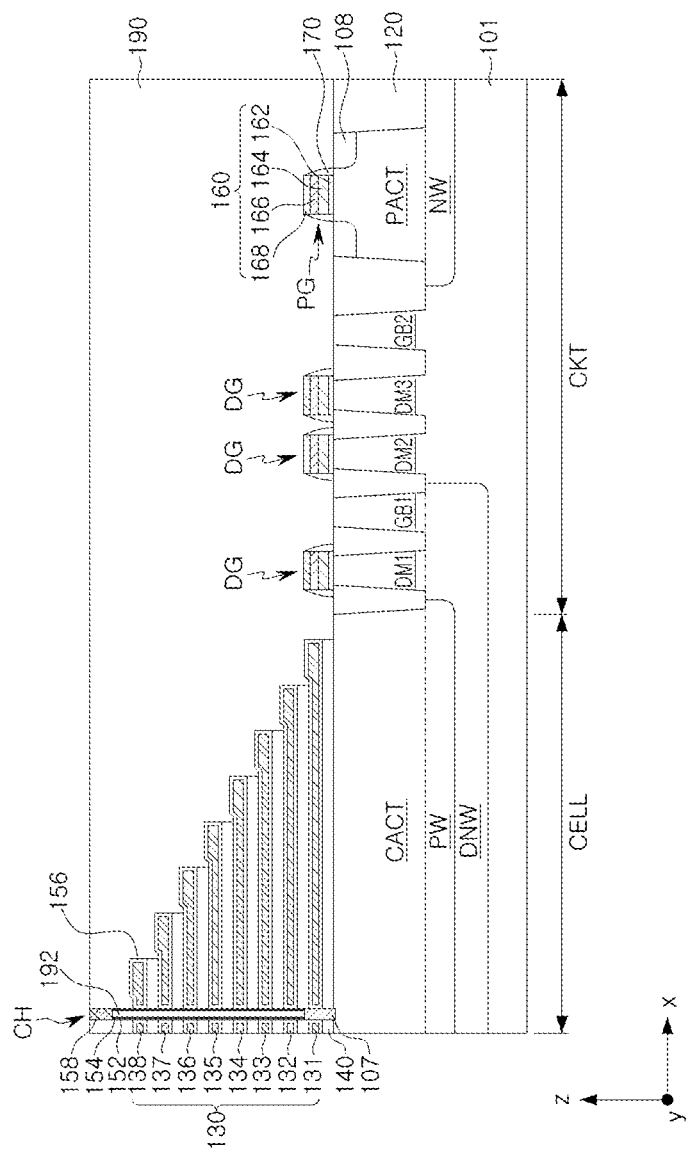

Referring to FIG. 9I, the sacrificial layer stack 180 may be removed, and a second gate dielectric layer 156 and the gate electrode stack 130 may be formed in a region from which the sacrificial layer stack 180 is removed.

First, a portion of the stack structure of the sacrificial layer stack 180 and the interlayer insulating layers 140 may be anisotropically etched to form the isolation region 194 as illustrated in FIG. 5. The isolation region 194 may have a trench shape extending in the x direction. The sacrificial layer stack 180 exposed by the isolation region 194 may be selectively removed with respect to the interlayer insulating layers 140, using, for example, a wet etching process. Accordingly, portions of side walls of the first gate dielectric layer 154 in each of the channels CHs between portions of each of the interlayer insulating layers 140 may be exposed.

The second gate dielectric layer 156 may be formed in the region from which the sacrificial layer stack 180 is removed, and a space within the second gate dielectric layer 156 may be filled with a conductive material to form the gate electrode stack 130. The gate electrode stack 130 may include a metal, polycrystalline silicon, or a metal silicide.

Subsequently, insulating layers having a spacer shape and a conductive layer filling a space between the insulating layers may be formed in the isolation region 194. In an example embodiment, the isolation region 194 may only be filled with an insulating material, and an impurity region may be formed in the substrate 101 below the isolation region 194.

Referring to FIGS. 5 and 6, gate contacts CT connected to the gate electrodes of the gate electrode stack 130, and first to third contact plugs MC1 to MC3 may be formed.

The gate contacts CT and the first to third contact plugs MC1 to MC3 may be formed simultaneously or sequentially. First, contact holes may be formed through the upper insulating layer 190, and a conductive material may be deposited in the contact holes to form the gate contacts CT and the first to third contact plugs MC1 to MC3. Prior to depositing the conductive material, a process of injecting impurities into the substrate 101 through the contact holes may be performed. Thus, plug doping regions 105a and 105b may be formed in upper regions of the first and second guard active regions GB1 and GB2 connected to the first and second contact plugs MC1 and MC2.

As set forth above, according to example embodiments of the present inventive concept, a semiconductor device having increased reliability may be provided by placing dummy active regions around an edge of a memory cell region.

While exemplary embodiments have been shown and described above, it will be apparent to those skilled in the art that modifications and variations could be made without departing from the scope of the present inventive concept, as defined by the appended claims.

What is claimed is:

1. A semiconductor device, comprising:
    a substrate having a first region and a second region, the first region including memory cells, and the second region including transistors for driving the memory cells; and
    device isolation regions disposed within the substrate to define active regions of the substrate,
    wherein the memory cells are formed on a first well disposed in the first region of the substrate, the first well having first conductivity-type impurities, and
    wherein the active regions include:
    a first guard active region surrounding the first region;
    a second guard active region surrounding a portion of the second region; and
    at least one dummy active region disposed between the first guard active region and the second guard active region,
    wherein at least one first contact plug is connected to the first guard active region, and at least one second contact plug is connected to the second guard active region, wherein the at least one first contact plug and the at least one second contact plug are for connecting to a power source, and
    the at least one dummy active region is formed at the same level as the first guard active region and the second guard active region, and the at least one dummy active region is not directly below any contact plugs.

2. The semiconductor device of claim 1, wherein the substrate includes:
    a second well disposed within the substrate to surround the first well, the second well including the first guard active region, and the second well including second conductivity-type impurities.

3. The semiconductor device of claim 1, wherein the second guard active region surrounds at least a transistor of the second region that is closest to the first region.

4. The semiconductor device of claim 1, wherein the substrate includes a second well disposed in the second region, the second well being disposed adjacent to the second guard active region.

5. The semiconductor device of claim 1, wherein the active regions further include a cell active region disposed in the first region, and another dummy active region further disposed between the cell active region and the first guard active region.

6. The semiconductor device of claim 1, wherein the at least one dummy active region is spaced apart from a boundary between the first region and the second region, and extends along the boundary.

7. The semiconductor device of claim 1, wherein each dummy active region of the at least one dummy active region has a line shape on a plane.

8. The semiconductor device of claim 1, wherein each dummy active region of the at least one dummy active region has a plurality of quadrangular patterns disposed in a row on a plane.

9. The semiconductor device of claim 1, wherein the at least one dummy active region includes a plurality of regions, the plurality of regions being spaced apart from one another, and the plurality of regions extending in parallel in one direction.

10. The semiconductor device of claim 1, further comprising:
    a dummy gate electrode disposed on a first dummy active region of the at least one dummy active region and being in a floating state.

11. The semiconductor device of claim 10, wherein the dummy gate electrode extends in one direction along the first dummy active region.

12. The semiconductor device of claim 10, wherein a width of the dummy gate electrode is greater than a width of the first dummy active region.

13. The semiconductor device of claim 1, further comprising:
    a channel region extending vertically in the first region; and
    gate electrodes spaced apart from one another and stacked along the channel region, the gate electrodes extending to have different lengths toward a boundary between the first region and the second region.

14. The semiconductor device of claim 13, wherein the gate electrodes extend in a first direction, and the at least one dummy active region extends in a second direction, perpendicular to the first direction.

15. The semiconductor device of claim 1, wherein, between the first guard active region and the second guard active region, a distance between the first guard active region or the second guard active region and the at least one dummy active region adjacent to the first guard active region or the second guard active region is less than 3 μm.

16. The semiconductor device of claim 1, wherein the first guard active region is formed in a second well disposed within the substrate to surround the first well.

17. A semiconductor device, comprising:
    a substrate having a first region and a second region, the first region including memory cells, and the second region including transistors for driving the memory cells; and
    device isolation regions disposed within the substrate to define active regions of the substrate,
    wherein the memory cells are formed on a first well disposed in the first region of the substrate, the first well having first conductivity-type impurities, and wherein the active regions include:

a first guard active region surrounding the first region;

a second guard active region surrounding a portion of the second region; and at least one dummy active region disposed between the first guard active region and the second guard active region, wherein at least one first contact plug is connected to the first guard active region, and at least one second contact plug is connected to the second guard active region, wherein the at least one first contact plug and the at least one second contact plug are for connecting to a power source, and the at least one dummy active region is formed at the same level as the first guard active region and the second guard active region, and the at least one dummy active region is not configured to transfer voltage or signals from any contact plugs to the substrate.

18. The semiconductor device of claim 17, wherein the substrate includes:

a second well disposed within the substrate to surround the first well, the second well including the first guard active region, and the second well including second conductivity-type impurities.

19. The semiconductor device of claim 17, wherein the second guard active region surrounds at least a transistor of the second region that is closest to the first region.

20. The semiconductor device of claim 17, wherein the at least one dummy active region is not vertically aligned with any contact plugs.

* * * * *